United States Patent [19]

Hilal

[11] Patent Number: 5,148,046
[45] Date of Patent: Sep. 15, 1992

[54] SUPERCONDUCTIVE SWITCHING DEVICE AND METHOD OF USE

[75] Inventor: Mohamed A. Hilal, Madison, Wis.

[73] Assignee: Wisconsin Alumni Research Foundation, Madison, Wis.

[21] Appl. No.: 594,728

[22] Filed: Oct. 9, 1990

[51] Int. Cl.⁵ .......................................... H03K 17/92
[52] U.S. Cl. .................... 307/245; 307/306; 505/860
[58] Field of Search .............. 307/245, 277, 306; 505/860

[56] References Cited

U.S. PATENT DOCUMENTS

| | | | |
|---|---|---|---|
| 2,913,881 | 11/1959 | Garwin | 307/245 |
| 2,977,575 | 3/1961 | Hagelbarger et al. | 307/245 |
| 3,093,749 | 6/1963 | Dillingham | 307/277 |
| 3,209,172 | 9/1965 | Young | 307/245 |
| 3,264,578 | 8/1966 | Newhouse | 307/245 |
| 3,280,337 | 10/1966 | Newhouse et al. | 307/245 |
| 3,384,762 | 5/1968 | Mawardi | 307/245 |
| 3,551,861 | 12/1970 | Boom et al. | 335/216 |
| 3,704,391 | 11/1972 | McConnell | 317/11 |
| 4,209,658 | 6/1980 | Hilal | 174/15 CA |
| 4,223,723 | 9/1980 | Hilal | 165/133 |
| 4,314,123 | 2/1982 | Hieronymus | 200/289 |
| 4,535,291 | 8/1985 | Lee et al. | 324/320 |
| 4,626,701 | 12/1986 | Harada et al. | 307/245 |
| 4,851,799 | 7/1989 | Hilal | 335/216 |
| 4,894,556 | 1/1990 | Hilal et al. | 307/106 |
| 4,897,558 | 1/1990 | Tidman | 307/245 |
| 4,954,727 | 9/1990 | Hilal | 307/112 |

OTHER PUBLICATIONS

Hilal, "Hybrid Transformer Current Zero Switch", Digest of Technical Papers, pp. 668–671, Sixth IEEE Pulsed Power Conference Jun. 29–Jul. 1, 1987.
Gray et al., "Thin Film Superconducting Switch", IEEE Transactions on Magnetics, vol. MAG–15, No. 1, Jan. 1979.
Lindsay et al., "Development of a Superconducting Switch for Magnetic Energy Storage Systems", IEEE Transactions on Magnetics, vol. MAG–11, No. 2, Mar. 1975.
Schmeider, "Superconducting Switches Using Radiation Induced Quenching", IEEE Transactions on Magnetics, vol. MAG–11, No. 2 Mar. 1975.
Harrowell, "A New Superconducting Switch", Phys. D: Appl. Phys., vol. 7, 1974.
Van de Klundert et al., "On Fully Superconducting Rectifiers and Fluxpumps. A Review, Part 2: Commutation Modes, Characteristic and Switches", Cyrogenics, 1981.

Primary Examiner—John Zazworsky
Attorney, Agent, or Firm—Olson & Hierl, Ltd.

[57] ABSTRACT

A superconductive switching device includes an elongated gate which is circumferentially spirally overwound by a trigger. Both the gate and the trigger are superconductive, but the resistance of the trigger is much smaller than the normal resistance of the gate. Only a relatively small current is needed to cause the device to switch from a closed configuration where current flows through the switching device to a closed configuration where current flows to a load. Operation of the switching device is suitable for use with high frequencies and, with such frequencies, the switching device operates in a cyclical manner.

35 Claims, 1 Drawing Sheet

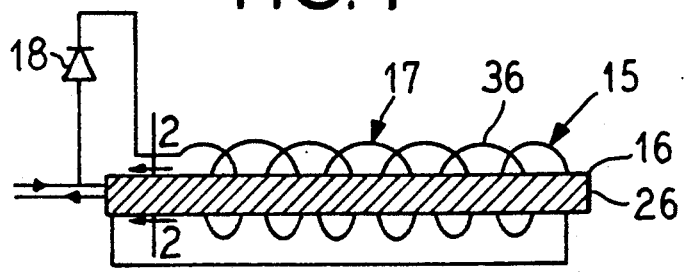
FIG. 1
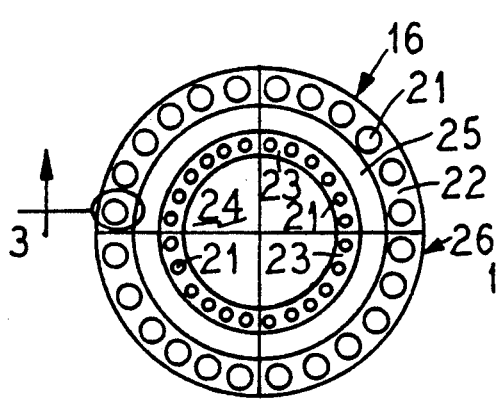
FIG. 2
FIG. 3
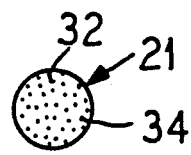
FIG. 4
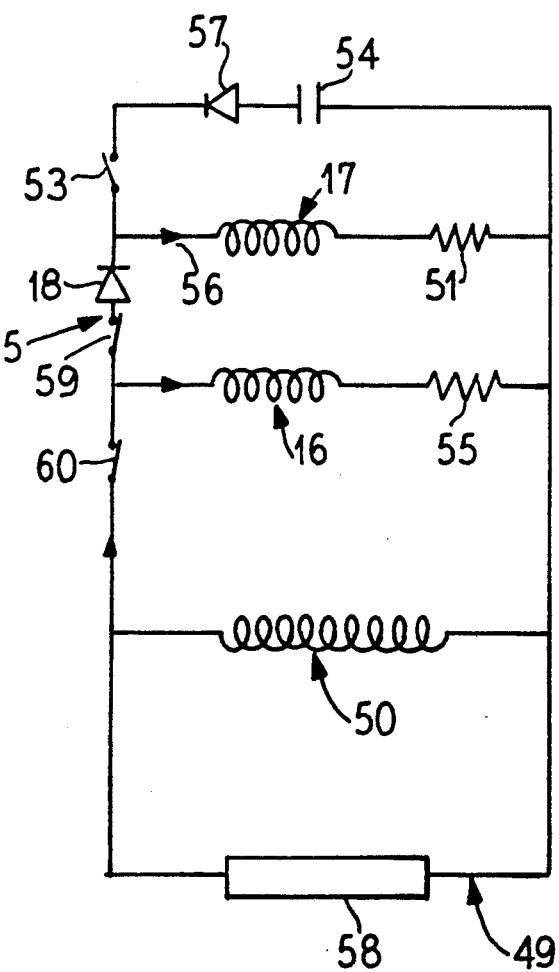

5,148,046

SUPERCONDUCTIVE SWITCHING DEVICE AND METHOD OF USE

This invention was made with United States Government support awarded by the NAVY (Grant Number: N00167-870095). The United States Government has certain rights in this invention.

FIELD OF THE INVENTION

The present invention relates to superconductive switching devices adapted for use at low or high frequencies.

BACKGROUND OF THE INVENTION

A cryotron is a superconductive device in which a changing magnetic field can cause a superconductive element to oscillate between states of low and high resistance. In such a device, current in an input circuit magnetically controls the superconductive-to-normal transition in one or more output circuits provided the current in each output circuit is less than its critical value.

Cryotrons are electronic devices with the potential for use in computer circuits or as on-off elements. However, they cannot be used for switching large currents. There is a need for a superconductive switching device which operates upon application of a relatively small current to direct the flow of a larger current.

The term "superconductivity" refers to a particular state of a material whereby the material exhibits "superconductive" properties. As used herein, the term "superconductivity" designates a material property characterized by zero electric resistivity and, ideally, zero permeability. The existence of superconductivity in a given material at a given time is dependent on the composition and temperature of the material, the electric current that the material is carrying and the strength of any magnetic field to which the material is exposed.

As used herein, the term "normal" refers to the usual resistive state of a superconductive material in which the material does not exhibit superconductive properties. For example, an alloy may exhibit normal conductivity at temperatures above a critical temperature, but is superconductive below the critical temperature. Thus, a material is said to be a "superconductor" when, below the critical temperature, it demonstrates the properties known as superconductivity, in particular, zero electrical resistance.

Superconductor technology offers many possible benefits. For example, a type of battery can be provided because the zero electrical resistance of a superconductor allows for the near permanent storage of electrical energy in the form of a permanently circulating current. Once a current is generated in a superconductive circuit, it will continue to flow with little or no loss of energy in what is termed a persistent mode.

The critical temperatures have, until recently, generally been between zero to about twenty degrees Kelvin. Recent developments have demonstrated the existence of "high" temperature superconductive materials which exhibit superconductive properties at about 100 degrees Kelvin. As these developments are proceeding rapidly, these high temperature superconductors will probably reach even higher temperatures. A major research goal is the development of a material that exhibits superconductive properties at or near room temperature.

At any temperature below the critical temperature for the material, the material will retain its superconductive properties unless it is exposed to a critical current (I) or a critical magnetic field strength (B) or a combination of both. The critical values for the current and the magnetic field are temperature dependent, with the values increasing as the temperature decreases. For example, when the temperature of the material is very close to but still less than the critical temperature, the current needed to revert the material to the normal state will be minimal. As a result, in order for a superconductor material to carry an appreciable current, the material is cooled to a temperature considerably below its critical temperature.

An I versus B curve may be constructed for a specific temperature for a particular superconductor. A frequently used temperature is 4.2 degrees Kelvin, the boiling point of liquid helium. Liquid helium is often used as the coolant to maintain superconductors at the low temperatures required.

One end of the I versus B curve is defined by the critical current needed to cause the superconductor to revert to its normal state when the magnetic field strength is zero. The other end is the critical magnetic field strength needed to cause the superconductor to revert to its normal state when the current is zero. The curve which connects these two points is known as the I versus B curve. Below the curve, the material is a superconductor. Above the curve, the material is in its normal resistive state.

When the characteristic material passes through the curve it undergoes a transition. The term "transition" relates to the state of a superconductor when it passes from the normal state to the superconductive state, or vice versa. The time duration of the transition state can be considered to exist between the beginning and the end of the transition wave form.

One way to cause a superconductor to go through a transition is to apply a switching current. The term "switching current" means of an applied current which causes an element of an opening switch to interrupt at a predetermined maximum voltage and predetermined frequency under defined operating conditions.

This switching current can be used to operate a switching device. The term "switching device" refers to a device which opens, or closes, or either one alternatively, one or more electric circuits.

Superconductors often have difficult stability problems. One problem arises if a small portion of a superconductor carrying a current reverts to the normal state. This can occur if the particular portion is exposed to heat and the temperature thereof exceeds the critical temperature. With the extremely low temperatures employed, such difficulties are encountered frequently.

When such a "hot spot" goes normal, it will continue to heat up because of the sudden electrical resistance encountered. In turn, this causes adjoining areas to also go normal and thereby the hot spot perpetuates itself throughout the superconductor. To rectify the situation, the current must be shut off and the superconductor cooled before continuing.

In the prior art, superconductive switching devices commonly suffer from such poor stability characteristics. For example, poor stability characteristics are commonly associated with prior art direct interrupt superconductivity switch devices. One reason for this instability is the need to operate these devices near their critical limits.

Also, in the prior art, superconductive switching devices frequently require application of a large switching current to produce a direct interrupt and associated switching from superconducting-to-normal in output circuit(s).

There is need for a superconducting switching device which has better stability characteristics than, for example, direct interrupt superconducting switches, and which can be caused to open with only a small current unlike cryotrons. The present invention provides such a device.

SUMMARY OF THE INVENTION

A superconducting switching device and method of use are disclosed. The switching device requires only a relatively small first current to switch from a closed configuration to an open configuration. The device incorporates a superconductive gate means having a non-superconductive normal state and a conductive state. When the device is in the conductive state, a second current can flow through the gate means without electrical resistance.

The gate means is in magnetic and parallel electrical communication with a superconductive trigger means. The trigger means also has a non-superconductive normal state and a conductive state. The first current is directed through the trigger means in its conductive state such that a magnetic field is generated which puts the gate means in its non-superconductive normal state. This transition directs the second current to the trigger means such that the trigger means is also put into its non-superconductive normal state.

The present disclosure also includes a circuit utilizing the switching device. A source of electrical power is in electrical communication with the gate means thus providing the second current. A load is in electrical communication with the trigger means, the source of electrical power and the gate means. Once the gate means and the trigger means enter the non-superconductive normal state, the second current will flow from the source to the load.

In addition, a method of switching is disclosed. The switching method combines the steps of providing a gate means and trigger means in magnetic and parallel electrical communication and then having the trigger means generate a magnetic field such that the gate means enters into the non-superconductive normal state.

This invention relates to a superconductive switching device which operates at approximately one half its critical limits. As a result, the present device has excellent stability characteristics. The present device can also be opened upon application of a relatively small current, typically around ten percent of the critical current. The switching device is usable both at low (less than about 10 hertz) and at high frequencies (from about 10 hertz to about 50 hertz), and it can be scaled to various sizes.

The present superconductive switching device overcomes the problems associated with the superconductive switching devices of the prior art. In its preferred embodiment, the switching device of the present invention is adapted for use at frequencies up to about 50 hertz.

The switching device includes the combination of a gate, a trigger and a diode. The device is used in association with circuitry and processes adapted for the utilization of such a switching device.

Further benefits and advantages will be apparent to those skilled in the art from the present specification taken with the accompanying drawings.

BRIEF DESCRIPTION OF THE DRAWINGS

In the drawings, which form a portion of this disclosure:

FIG. 1 is a diagrammatic illustration of one embodiment of a superconductive switching device of the present invention;

FIG. 2 is a vertical sectional view taken along the plane 2—2 of FIG. 1 showing the structure of the gate means employed in the switching device embodiment of FIG. 1;

FIG. 3 is an enlarged sectional view taken along the plane 3—3 of FIG. 2 showing the structure of a superconducting strand forming the strand plurality of the gate means shown in FIGS. 1 and 2; and FIG. 4 is a schematic diagram illustrating one embodiment of a circuit which incorporates the switching device embodiment of FIG. 1.

DETAILED DESCRIPTION OF A PREFERRED EMBODIMENT

The device of the present invention can be assembled and used in many different forms. This detailed description and the accompanying drawings disclose only one specific form which provides an example of a preferred embodiment of the present device. It is not intended to limit the invention to the embodiment illustrated.

A preferred embodiment for a superconductive switching device 15 is disclosed. The switching device 15 requires only a relatively small first current to switch from a closed configuration to an open configuration. The device 15 incorporates a superconductive gate means having a non-superconductive normal state and a conductive state. When device 15 is in the conductive state, a second current can flow through the gate means without electrical resistance.

The gate means is in magnetic and parallel electrical communication with a superconductive trigger means also having a non-superconductive normal state and a conducting state. When the first current flows through the trigger means, a magnetic field is generated which puts the gate means in its non-superconductive normal state. This transition directs the second current to the trigger means which puts the trigger means in its non-superconductive normal state.

The devices in the present disclosure include a circuit utilizing the switching device described. A source of electrical power is in electrical communication with the gate means to provide the second current flowing through the gate means. In the preferred embodiment, the source is a storage inductor 50.

A load is in electrical communication with the trigger means, the source and the gate means such that once both the gate means and the trigger means enter the non-superconductive normal state, the second current flows to the load.

In the preferred embodiment, the gate means comprises a gate 16 and the trigger means comprises a trigger 17. Referring to the drawings, FIG. 1 shows the superconductive switching device 15 according to the present invention which incorporates the gate 16, the trigger 17 and a diode 18. The entire device is maintained in a cryogenic vessel (not shown) which maintains the temperature of the device below about 100 degrees Kelvin, if the material is a high temperature superconductor, or about 10 degrees Kelvin, if a low temperature superconductor is utilized.

In the low temperature preferred embodiment, the coolant employed is liquid helium which is maintained at a temperature of about 4 degrees Kelvin. In a high temperature preferred embodiment, the coolant employed is liquid nitrogen at a temperature of about 78 degrees Kelvin.

Referring to FIG. 2, the gate 16 preferably comprises a plurality of superconducting strands 21 which are preferably arranged as two longitudinally extending concentric monolayers embedded in a matrix layer 22. An inner layer 23 is located circumferentially upon an elongated cylindrical core 24. An intermediate ring layer 25 separates the inner layer 23 of strands 21 from the outer layer 26 of strands 21. The preferred structure of gate 16 resembles a coaxial cable. The strands 21 are twisted to define a generally helical path along the cylinder surface.

The purpose of the helical path is to prevent the strands 21 from coupling their electric fields. When the strands 21 couple electrically, they essentially act as one wire instead of a multiplicity of wires. Then if an instability occurs in one wire, it will propagate in all of the wires, thus magnifying the original instability. By following a helical path, the electric field will reverse every half twist. By keeping the distance less than the critical twist pitch, there will be insufficient distance to build up transverse currents and the strands 21 will remain decoupled. The critical twist pitch ($l_c$) is defined by:

$$l_c = 4(ap J_c/B)^{\frac{1}{2}}$$

where:
 a = strand half-width
 p = resistivity
 $J_c$ = critical current density
 B = rate of change of field In a preferred embodiment, the core 24 is filled with the selected coolant and has a diameter of between about 0.20 to 0.25 cm. The matrix material in which the inner layer 23 and the outer layer 26 of strands 21 is embedded comprises a non-superconductive material such as copper, bronze or a copper-nickel alloy. The inner layer 23 has a width of between about 0.05 to 0.50 cm. The outer layer 26 also has a width of about 0.05 to 0.50 cm. The ring layer 25 is comprised of an insulating material such as Teflon and is about 0.25 cm wide.

The gate 16 thus typically and preferably has an outside diameter in the range of about 0.50 cm to about 4.0 cm. The length of the gate wire is dependent on the required resistance of the switch when it is opened.

Initially, the magnetic field B is zero in the core 24 and outside of gate 16. The magnetic field B in the ring layer 25 is defined by the expression:

$$B = m_o \frac{I}{2\pi r} \quad (1)$$

where
 $m_o$ is the permeability constant;
 I is the gate current in amperes; and
 r is the effective radius of the gate 16.

Referring to FIG. 3, each individual strand 21 has a diameter in the range of about 0.05 to about 0.25 cm and comprises a plurality of about 100 to about 1000 filaments 32 which are each embedded in a high resistivity matrix or substrate 34. Each filament 32 has a diameter in the range of about 1 to about 10 millimicrons ($\mu$m).

Filaments 32 preferably are constructed of niobium-tin or a niobium-titanium alloy if a low temperature superconductor is used. The invention could also use a high current density, high temperature superconductor when such becomes available. The matrix 34 in which the filaments are embedded is a non-superconductor metal such as a copper-nickel alloy.

The gate 16 is enclosed by the trigger 17. Preferably, the trigger 17 comprises a superconducting trigger strand 36 which is spirally wound over the surface of gate 16. Each trigger strand 36 can comprise, for example, a film of niobium-tin alloy on a cylindrical substrate of silica.

One end of trigger 17 is connected to one electrical input of gate 16 while the other end of trigger 17 is connected to the other electrical lead of gate 16 through an intervening diode 18. Thus, the trigger 17 and the gate 16 are each connected in series with the diode 18, while the trigger 17 is connected in parallel with the gate 16.

The diode 18, as those skilled in the art will readily appreciate, allows current to flow through the helical winding of the trigger 17 in one direction only. The diode 18 is preferably a low temperature diode.

The operation of the device 15 is exemplified by the illustrative circuit 49 which is shown diagrammatically in FIG. 4. For present illustration purposes, it is assumed that the storage inductor 50 is initially fully charged and that the device 15 is initially in a closed configuration. The storage inductor 50 preferably has a capacity of 100 kwh to 20 mwh.

During a persistent mode of operation, the current flows through gate 16 because a resistor 51 has been placed in series with the trigger 17 winding. It should be appreciated that the total resistance of the resistor 51 and the superconductive trigger 17 must be less than the normal resistance of the gate 16. In the preferred embodiment, the current can be anywhere from about 10 amps to about 400 kiloamps.

The opening of device 15 is initiated by closing the switch 53, preferably a low current switch. Many other suitable switches will be readily apparent to those skilled in the art.

The closing of switch 53 causes the capacitor 54 to discharge through the winding of the trigger 17. The capacitor 54 has a polarity which causes a current to flow through the winding of the trigger 17 in the direction shown by arrow 56. A diode 57 has a backward resistance that will substantially prevent oscillation in the circuit loop defined by the diode 57, capacitor 54 and trigger 17. The backward resistance of diode 57 is not sufficient to prevent the recharging of capacitor 54.

Capacitor 54 must be designed with the end use in mind. If it is desired to cycle the switch, a large capacitance should be employed to allow multiple discharges. If only one cycle is needed, the capacitance need only be large enough to discharge once to initiate the cycle.

When the current flows through the trigger strand 36 of the trigger 17 as the capacitor 54 discharges, a magnetic field is produced both in the helical winding of the trigger 17 and in the gate 16. Gate 16 is thus exposed to a magnetic field represented by the expression:

$$B \approx \mu_o[(I_g/2\pi r)^2 + K^2(n\,I_t)^2]^{\frac{1}{2}}, \quad (2)$$

where $I_g$ is the gate current;
$I_t$ is the trigger current;
r is the effective radius of the gate winding;
n is the number of turns per meter for the helical winding of the trigger; and
K is a constant which is a function of the helical winding geometry.

As the capacitor 54 discharges, the gate 16 becomes resistive due to this magnetic field. The resistance of gate 16 is generally indicated by resistor 55. The resistor 55 has zero electrical resistance when gate 16 is in the superconductive state, a variable resistance when gate 16 is in transition between states and, finally, a constant non-zero resistance when gate 16 is in its normal non-superconductive state. As a consequence of this increasing resistance, current flow transfers from gate 16 to trigger 17. As more current transfers from the gate 16, the magnetic field affecting gate 16 further increases until gate 16 is triggered normal (or is rendered non-superconductive) at the point when the I versus B curve for gate 16 is crossed.

Immediately after the gate normalization, only a small fraction of the current will be required to activate the trigger 17 because the I versus B curve of the trigger 17 will be crossed and the trigger 17 will also go normal (or be rendered non-superconductive). As a consequence, the current flow rapidly transfers to a load 58. Note that the resistance of the load 58 must be less than the normal resistance of the trigger 17 and the gate 16. Thus, a small switching current induces the device to switch.

Once the current ceases to flow through the trigger 17, the gate 16 will begin to recover its superconductive properties.

Two low current switches 59 and 60 can be utilized, if desired, to improve the switching characteristics and efficiency of device 15 as shown in circuit 49. First switch 59 is opened when the current level required to trigger the gate 16 to normal is exceeded. Second switch 60 is opened when the current flowing in the gate 16 reaches a sufficiently low value. The operation of switches 59 and 60 increases the open resistance of the gate 16.

When it is desired to use the present device in a high frequency application of between about 10 to 50 hertz, a circuit such as circuit 49 can be used. In such a circuit and such an application, the device 15 is required to be triggered only once initially by the closing of switch 53. Thereafter, once device 15 is opened, as explained above, the current transfers to the load 58; and the gate 16 and the trigger 17 each recover their initial superconductivity. Switches 59 and 60 are then closed, and the current flows back through the gate 16 and the trigger 17. The current then recharges the capacitor 54 and the switching cycle is repeated, the backward resistance of diode 57 being low enough to allow such recharging while high enough to prevent oscillation.

During operation of the switching device 15, it will be appreciated that the gate 16 operates either in the normal region or in the transition region during current transfer (switching).

Also, the total resistance of the trigger 17 and resistor 51 characteristically is much smaller than the resistance of the gate 16 when gate 16 goes normal so that current will transfer from gate 16 to trigger 17. This can be achieved with a low resistivity substrate or matrix material, such as, for example, copper, or the like, in the trigger strand 36.

The device 15 as described may be used in any high current density applications and including (for example) electromagnetic launchers, welding machines and magnetic forming machines. Such uses would be substituted for the load 58, and those skilled in the art will certainly appreciate similar uses for the present switching device.

Although the invention has been described with reference to particular embodiments, it should be understood that many variations and modifications will be apparent to those skilled in the art. The scope of this invention is not limited by the foregoing specific embodiments.

What is claimed is:

1. A superconductive switching device which requires a relatively small first current to switch, the switching device comprising:
   a) superconductive gate means having a non-superconductive normal state and a conductive state which permits a second current to flow through the gate means without substantial electrical resistance; and
   b) superconductive trigger means in magnetic and parallel electrical communication with the gate means such that when the first current flows through the trigger means a magnetic field is generated which puts the gate means in its non-superconductive normal state and the second current from the gate means diverts to the trigger means and renders the trigger means non-superconductive.

2. The switching device according to claim 1 further comprising capacitor means in electrical communication with the trigger means for providing the first current to the trigger means.

3. The switching device according to claim 2 further comprising switch means in electrical communication with the trigger means and the capacitor means for controlling the first current to the trigger means.

4. The switching device according to claim 1 wherein the gate means comprises a plurality of superconducting strands arranged in at least one longitudinally extending monolayer that is cylindrically configured.

5. The switching device according to claim 4 wherein the gate means comprises two such longitudinally extending monlayers with one such layer being in radially spaced but concentric relationship relative to the other thereof.

6. The switching device according to claim 4 wherein the superconducting strands are twisted to define a generally helical path.

7. The switching device according to claim 6 wherein the helical path has a pitch that is less than a critical twist pitch thereof to prevent electric coupling between the strands.

8. The switching device according to claim 4 wherein the superconducting strands further comprise a plurality of superconductive filaments embedded within a high resistivity matrix.

9. The switching device according to claim 8 wherein the filaments comprise a low temperature superconductive material.

10. The switching device according to claim 9 wherein the high resistivity matrix comprises a non-superconductive metal.

11. The switching device according to claim 4 wherein the trigger means comprises a superconductive trigger strand wound over the surface of the gate means.

12. The switching device according to claim 11 wherein the superconductive trigger strand is composed of a superconductive metal film over a cylindrical non-superconductive substrate.

13. The switching device according to claim 2 wherein the capacitor means has a polarity which causes current to flow through the trigger means in one direction only.

14. The switching device according to claim 13 further comprising diode means in electrical communication in series with the trigger means and the gate means, the diode means being oriented to cause the capacitor means to cause the first current to flow only through the trigger means.

15. The switching device according to claim 14 further comprising second diode means in electrical communication in series with the capacitor means and the trigger means, the second diode means being oriented to prevent electrical oscillation between the capacitor means and the trigger means.

16. The switching device according to claim 1 wherein the trigger means further comprising an electrical resistance means having an electrical resistance greater than the superconductive resistance of the gate means but less than the normal resistance of the gate means.

17. A circuit including a superconductive switching device which requires a relatively small first current to switch, the circuit comprising:
   a) superconductive gate means;
   b) a source of electrical power in electrical communication with the gate means whereby a second current from the source flows through the gate means without substantial electrical resistance;
   c) superconductive trigger means in magnetic and parallel electrical communication with the gate mans whereby the first current flows through the trigger means and generates a magnetic field which renders the gate mans non-superconductive, the second current from the source diverts to the trigger means and renders the trigger means non-superconductive; and
   d) a load in electrical communication with the trigger means, the source and the gate means such that the second current flows to the load once the trigger means and the gate means are rendered non-superconductive.

18. The circuit according to claim 17 further comprising capacitor means in electrical communication with the trigger means for providing the first current flow to the trigger means.

19. The circuit according to claim 18 further comprising switch means in electrical communication with the trigger means and the capacitor means for controlling the first current flow to the trigger means.

20. The circuit according to claim 17 wherein the gate means comprises a plurality of superconducting strands arranged in two longitudinally extending monolayers, each monolayer being cylindrically configured and one such monolayer being oriented concentrically relative to the other thereof.

21. The circuit according to claim 20 wherein the superconducting strands are twisted to define a generally helical path having a pitch that is less than a critical twist pitch thereof to prevent electric coupling between the strands.

22. The circuit according to claim 20 wherein the superconducting strands further comprise a plurality of low temperature superconductive filaments within a non-superconductive metal matrix.

23. The circuit according to claim 17 wherein the trigger means comprises a superconductive trigger strand composed of a superconductive metal film over a cylindrical non-superconductive substrate, the trigger strand being wound over the surface of the gate means.

24. The circuit according to claim 18 further comprising diode means in electrical communication in series with the trigger means and the gate means, the diode means being oriented to cause the capacitor means to cause the first current to flow only through the trigger means and wherein the capacitor means has a polarity which causes the first current to flow through the trigger means in one direction only.

25. The circuit according to claim 24 further comprising second diode means in electrical communication in series with the capacitor means and the trigger means, the second diode means being oriented to prevent electrical oscillation between the capacitor means and the trigger means.

26. The circuit according to claim 17 wherein the trigger means has an electrical resistance greater than the superconductive resistance of the gate means but less than the normal resistance of the gate means.

27. The circuit according to claim 17 further comprising first switch means in electrical communication in series with the gate means and the trigger means.

28. The circuit according to claim 27 further comprising second switch means in electrical communication in series with the gate means and the source.

29. A method of using a relatively small current to switch a superconductive switching device comprising the steps of:
   a) providing a superconducting gate means, the gate means comprising a plurality of superconducting strands one longitudinally extending in at least one monolayer;
   b) providing a superconducting trigger means that is electrically connected in parallel with the gate means and that also is in magnetic communication with the gate means; and
   c) applying a relatively small current to the trigger means which current is sufficient to cause the resulting magnetic field that communicates with the gate means to change the gate means from its superconductive state to its non-superconductive state.

30. The method according to claim 29 wherein the plurality of superconducting strands is arranged in two longitudinally extending monolayers oriented each monolayer being cylindrically configured and one such monolayer being oriented concentrically relative to the other thereof.

31. The method according to claim 30 wherein the superconducting strands are twisted to define a generally helical path with a pitch less than a critical twist pitch to prevent electric coupling between the strands.

32. The method according to claim 31 wherein the superconducting strands further comprise a plurality of low temperature superconductive filaments embedded in a non-superconductive metal matrix.

33. The method according to claim 29 wherein the trigger means comprises a superconductive trigger strand, the trigger strand being wound over the surface of the gate means.

34. The method according to claim 29 wherein the trigger means has an electrical resistance greater than the superconductive resistance of the gate means but less than the normal non-superconductive resistance of the gate means.

35. The method according to claim 29 further comprising the steps of:
providing a first switch means in electrical communication in series with the gate means and the trigger means, the first switch means opening when the gate means is rendered non-superconductive; and
providing a second switch means in electrical communication in series with the gate means and the source, the second switch opening when current ceases flowing through the gate means.

* * * * *